United States Patent
Arzberger

(10) Patent No.: US 11,946,978 B2
(45) Date of Patent: Apr. 2, 2024

(54) METHOD, APPARATUS AND COMPUTER PROGRAM PRODUCT FOR ESTIMATING THE SERVICE LIFE OF BATTERY STORAGE SYSTEMS

(71) Applicant: Siemens Aktiengesellschaft, Munich (DE)

(72) Inventor: Arno Arzberger, Bayern (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 17/866,652

(22) Filed: Jul. 18, 2022

(65) Prior Publication Data

US 2023/0033057 A1    Feb. 2, 2023

(30) Foreign Application Priority Data

Jul. 23, 2021  (EP) .................................... 21187489

(51) Int. Cl.
 G01R 31/396 (2019.01)
 G01R 31/382 (2019.01)
 (Continued)

(52) U.S. Cl.
 CPC ......... G01R 31/396 (2019.01); G01R 31/382 (2019.01); G01R 31/392 (2019.01); H02J 7/0048 (2020.01); H02J 7/005 (2020.01)

(58) Field of Classification Search
 None
 See application file for complete search history.

(56) References Cited

U.S. PATENT DOCUMENTS

| 6,307,377 B1 | 10/2001 | Cummings et al. ........... 324/427 |
| 8,912,761 B2 | 12/2014 | Izumi ............................ 320/148 |

(Continued)

FOREIGN PATENT DOCUMENTS

| DE | 10328721 A1 | 1/2005 |
| DE | 102014220914 A1 | 4/2016 |

(Continued)

OTHER PUBLICATIONS

U.S. Non-Final Office Action, U.S. Appl. No. 17/866,733, 23 pages, dated Aug. 2, 2023.

(Continued)

*Primary Examiner* — Jas A Sanghera
(74) *Attorney, Agent, or Firm* — Slayden Grubert Beard PLLC

(57) ABSTRACT

Various embodiments of the teachings herein include a method for classifying a battery cell. The method may include: measuring load cycles of the cell using a coulometry apparatus; repeating the measurement until an abort criterion is met; determining values for a discharge capacity of the battery cell using a first and a second calculation rule; wherein a calibration is input differently into the first and the second rule; carrying out an optimization method to determine a calibration of the current measurement with the greatest match between the first and the second discharge capacity; determining an aging criterion for the battery cell based on the result of the measurement; and sorting the battery cell into one of several classification ranges based on the aging criterion.

14 Claims, 3 Drawing Sheets

(51) Int. Cl.
*G01R 31/392* (2019.01)
*H02J 7/00* (2006.01)

(56) References Cited

U.S. PATENT DOCUMENTS

| | | | |
|---|---|---|---|
| 2006/0250137 A1 | 11/2006 | Frey et al. | 324/426 |
| 2012/0215472 A1 | 8/2012 | Tezuka et al. | 702/63 |
| 2012/0310565 A1 | 12/2012 | Redey | 702/63 |
| 2013/0234672 A1 | 9/2013 | Kubota et al. | 320/134 |
| 2013/0325279 A1 | 12/2013 | Fujimoto et al. | 701/74 |
| 2014/0095090 A1 | 4/2014 | Chen et al. | 702/63 |
| 2015/0301118 A1* | 10/2015 | Tao | H02J 7/0048 702/63 |
| 2016/0109526 A1 | 4/2016 | Geffin et al. | 702/189 |
| 2016/0109528 A1 | 4/2016 | Schleicher et al. | 324/430 |
| 2018/0017628 A1 | 1/2018 | Takegami et al. | |
| 2020/0284846 A1 | 9/2020 | Pajovic et al. | |
| 2020/0341064 A1 | 10/2020 | Miftahullatif et al. | |
| 2022/0120815 A1 | 4/2022 | Wei et al. | |
| 2023/0028368 A1 | 1/2023 | Arzberger | |
| 2023/0031420 A1 | 2/2023 | Arzberger et al. | |

FOREIGN PATENT DOCUMENTS

| | | | | |
|---|---|---|---|---|
| EP | 4063882 A1 | 9/2022 | | G01R 31/367 |
| JP | 2011222343 A | 11/2011 | | |
| JP | 2012122787 A | 6/2012 | | |
| JP | 2013249026 A | 12/2013 | | |
| JP | 2017067788 A | 4/2017 | | |
| JP | 2017083474 A | 5/2017 | | |
| JP | 2017099221 A | 6/2017 | | |
| JP | 6494840 | 4/2019 | | H01M 10/54 |
| JP | 2022182460 A | 12/2022 | | |
| JP | 2023016707 A | 2/2023 | | G01R 31/382 |
| JP | 7423697 B2 | 1/2024 | | G01R 31/367 |
| WO | 83/02005 A1 | 6/1983 | | |
| WO | 2019/142550 A1 | 7/2019 | | |
| WO | 2021/089786 A1 | 5/2021 | | G01R 31/367 |

OTHER PUBLICATIONS

Extended European Search Report, Application No. 21187494.6, 6 pages, dated Jan. 21, 2022.
Extended European Search Report, Application No. 21187495.3, 7 pages, dated Jan. 21, 2022.
Zheng, Yuejiu et al: "Study on the correlation between state of charge and coulombic efficiency for commercial lithium ion batteries", Journal of Power Sources, Elsevier, Amsterdam, NL, vol. 289, pp. 81-90, XP029242205, May 18, 2015.
Zhang, Shuzhi et al: "A rapid online calculation method for state of health of lithium-ion battery based on coulomb counting method and differential voltage analysis"; Journal of Power Sources, Elsevier, Amsterdam, NL; vol. 479, XP086345101, Aug. 31, 2020.
Japanese Office Action, Application No. 2022101470, 8 pages, dated Oct. 3, 2023.
Japanese Office Action, Application No. 2022101471, 9 pages, dated Oct. 3, 2023.
Japanese Notice of Allowance, Application No. 2022101471, 7 pages, dated Dec. 19, 2023.
Smith, A.J. et al., "Precision Measurements of the Coulombic Efficiency of Lithium-Ion Batteries and of Electrode Materials for Lithium-Ion Batteries," Journal of the Electrochemical Society, vol. 157, No. 2, 7 pages, Dec. 17, 2009.
Smith, A.J. et al., "Interpreting High Precision Coulometry Results on Li-ion Cells," Journal of the Electrochemical Society, vol. 158, No. 10, 7 pages, Aug. 15, 2011.
Fleischauer, M.D. et al., "Calibration Process for Rechargeable Cell and Battery Test Systems," Review of Scientific Instruments, vol. 90, 8 pages, Apr. 9, 2019.
U.S. Final Office Action, U.S. Appl. No. 17/866,733, 21 pages, dated Jan. 29, 2024.
Japanese Office Action, Application No. 2022094914, 10 pages, dated Feb. 6, 2024.

\* cited by examiner

METHOD, APPARATUS AND COMPUTER PROGRAM PRODUCT FOR ESTIMATING THE SERVICE LIFE OF BATTERY STORAGE SYSTEMS

CROSS-REFERENCE TO RELATED APPLICATIONS

This application claims priority to EP Application No. 21187489.6 filed Jul. 23, 2021, the contents of which are hereby incorporated by reference in their entirety.

TECHNICAL FIELD

The present disclosure relates to battery storage systems. Various embodiments of the teachings herein include methods, apparatuses, and computer program products for estimating the service life of battery storage systems, in particular for determining a probable capacity loss of the battery storage system.

BACKGROUND

Lithium-ion accumulators are used in many mobile and fixed-location applications as energy storage systems on account of their high power and energy density. A new aspect in this regard is the sharp increase in use in electrically driven vehicles and as fixed-location buffer storage systems for supplying electricity in buildings. In the following, the accumulators as used in these technical areas of application are referred to in everyday language as batteries or battery storage systems.

Battery storage systems that are used to supply vehicles or for the electrical network connection must have a voltage of between 400 V and 1000 V. For this purpose, a larger number of several hundred battery cells are typically connected in series. In addition, instead of individual battery cells, blocks that each comprise a plurality of battery cells connected in parallel can be connected in series in order to increase the capacity or current-carrying capacity.

A disadvantage here is that the behavior of such battery storage systems is determined by the poorest battery cell or the poorest block in the series circuit in each case. If for example just one of the battery cells ages significantly faster than the other battery cells in the series circuit, the entire battery nevertheless appears significantly aged.

For this reason, attempts are typically made to classify battery cells after manufacture according to their probable service life, in other words expected aging. This step is associated with what is known as the "end-of-line test" in the process chain, and is declared for example as the "self-discharge test" process step. Such a self-discharge test can take place for example such that the formed battery cells are stored over a longer period of several weeks, wherein the cell voltage is measured at regular intervals. An estimate is then made as to the aging of the battery cells on the basis of the self-discharge rate. Disadvantages of this are the long storage and measurement of the cells, which are cost-intensive, and the fact that it is not possible to predict the aging with very high precision on the basis of the self-discharge tests. The individual course of the cell aging therefore has a high bandwidth for the same classification result.

SUMMARY

The teachings of the present disclosure include methods and apparatuses with which the classification of battery cells can be carried out with greater precision. For example, some embodiments include a method for classifying a battery cell (2), in which a plurality of load cycles (100) of the battery cell (2) is measured by means of a high-precision coulometry apparatus (4), wherein the result of the measurement comprises a plurality of current values, the measurement is carried out until an abort criterion is met, based on the result of the measurement, a first and second value are determined for a discharge capacity of the battery cell (2) by means of a first and a second calculation rule, wherein a calibration of the current measurement is input differently into the first and second calculation rule, and an optimization method is carried out in which a calibration of the current measurement is determined, with which the greatest match is achieved between the first and second discharge capacity determined, based on the result of the measurement, an aging criterion is determined for the battery cell (2), and based on the aging criterion, the battery cell (2) is sorted into one of several classification ranges.

In some embodiments, a coulombic efficiency of the battery cell (2) is determined as an aging criterion.

In some embodiments, an energy efficiency and/or an effective cell internal resistance and/or a capacity loss per cycle of the battery cell (2) is determined.

In some embodiments, the aging criteria are stored with an identification code for the battery cell (2) in a database.

In some embodiments, real aging data of battery cells (2) in use in a battery storage system is received and the classification ranges are adjusted on the basis of the real aging data and the stored aging criteria.

In some embodiments, the load cycles (100) comprise a discharge of less than 40%, in particular less than 25%.

In some embodiments, the load cycles (100) can work with a C coefficient of between 0.5 and 1.5, in particular between 0.8 and 1.2.

In some embodiments, several operating points are used for at least a part of the load cycles (100).

In some embodiments, a load cycle (100) comprises a first discharging, in which a first charge quantity from a first state of charge (21) to a second state of charge (22) is measured, a subsequent first charging, in which a second charge quantity from the second state of charge (22) to a third state of charge (23) is measured, and a second discharging, in which a third charge quantity from the third state of charge (23) to a fourth state of charge (24) is measured, wherein the charging and discharging of the load cycle (100) takes place between a lower voltage and an upper voltage of the battery cell (2).

In some embodiments, a first charge displacement is determined by means of a difference between the fourth state of charge (24) and the second state of charge (22), and a second charge displacement by means of a difference between the third state of charge (23) and the first state of charge (21), a capacity loss is determined from the difference between the first charge displacement and the second charge displacement, and a mean capacity loss is determined on the basis of at least two capacity losses of different load cycles (100).

In some embodiments, the relative change in capacity loss in two or more consecutive load cycles (100) is used as the abort criterion.

In some embodiments, the abort criterion is selected as a function of the classification resulting from the measurement result provided.

As another example, some embodiments include an apparatus (1) for carrying out one or more of the methods as described herein, having a high-precision coulometry apparatus (4), and a computing unit (10) with a memory for receiving results of a measurement series on the battery cell (2), wherein the computing unit (10) is embodied to carry out the optimization method and the sorting.

As another example, some embodiments include a computer program product (13) which is directly loadable into a memory of a programmable computing unit (10), having program code means in order to carry out one or more of the methods described herein when the computer program product (13) is executed in the computing unit (10).

BRIEF DESCRIPTION OF THE DRAWINGS

Further features, properties, and advantages of the teachings of the present disclosure are disclosed in the following description, making reference to the accompanying drawings. The figures show in schematic form.

DETAILED DESCRIPTION

Figure 1:
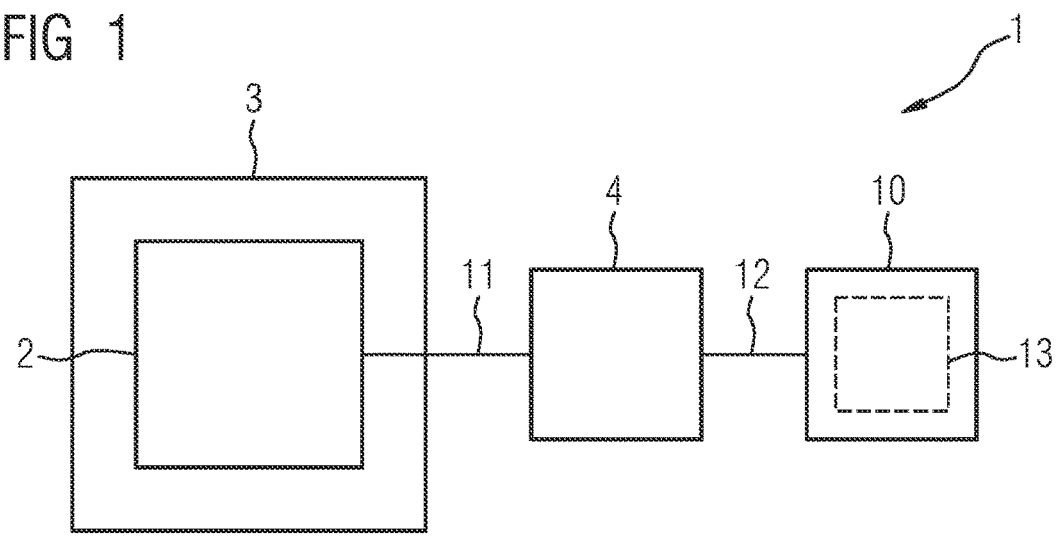
FIG. 1 an apparatus for classifying a battery cell incorporating teachings of the present disclosure.

In some embodiments, a plurality of load cycles of the battery cell is measured by means of a high-precision coulometry apparatus, wherein the result of the measurement comprises a plurality of current values. Here, an operating point that is as informative as possible but is at the same time protective is selected for the load cycles, in particular with a state of charge of less than 50%.

The measurement is carried out until an abort criterion is met and, based on the result of the measurement, a first and second value are determined for a discharge capacity of the battery cell by means of a first and a second calculation rule, wherein a calibration of the current measurement is input differently into the first and second calculation rule, and an optimization method is carried out in which a calibration of the current measurement is determined, with which the greatest match is achieved between the first and second discharge capacity determined.

Finally, an aging criterion of the battery cell is determined on the basis of the measurement results and the battery cell is sorted into one of several classification ranges on the basis of the aging criterion.

The apparatuses described herein are embodied to carry out one or more of the methods described herein, and comprises a high-precision coulometry apparatus and a computing unit with a memory for receiving results of a measurement series on the battery cell, wherein the computing unit is embodied to carry out the optimization method and to sort the battery cell into one of several classification ranges.

In some embodiments, a possibility is created to enable a classification to be performed relatively rapidly on the basis of the service life expectation for a battery cell. In other words, a new method is therefore created for the accelerated quality checking of lithium-ion cells after formation and in order to improve the classification precision. While a duration of several weeks can be required for quality determination according to the prior art, this duration is shortened to a few days by the teachings herein, as a result of which the capital outlay for storage during the test can be significantly reduced.

In some embodiments, a coulombic efficiency of the battery cell can be determined as an aging criterion. In some embodiments, an energy efficiency and/or an effective cell internal resistance and/or a capacity loss per cycle of the battery cell can also be determined as an aging criterion.

In some embodiments, if two or more of the specified variables are used, quality assessment is no longer carried out on the basis of just a single metric, namely the self-discharge rate, but instead on the basis of a plurality of independent KPIs determined in a single measurement. This makes the QM process more robust and informative, and opens up new possibilities for integrating data flowing back from the field deployment of the battery cells produced.

In some embodiments, the aging criteria can be stored in a database together with an identification code for the battery cell. Such storage enables a subsequent evaluation of the data thus collected, for example in order to identify differences with regard to different production lots. Furthermore, such storage enables a comparison with aging data acquired during the field deployment of the battery cells. In some embodiments, real aging data of battery cells in use in a battery storage system may be received and the classification ranges adjusted on the basis of the real aging data and the stored aging criteria. The real aging data can also be used to determine a modified operating point, which enables more precise predictions to be made in future.

The load cycles can comprise a discharge of less than 40%, in particular less than 25%. Furthermore, the load cycles can work with a C coefficient of between 0.5 and 1.5, in particular between 0.8 and 1.2. In conjunction with the charge, this creates an advantageous operating point for measuring the battery cell, in which the state of charge (SOC) in conjunction with the discharge (DOD) is not too high, in order to reduce the resulting electricity costs and on the other hand the discharge is sufficient for an informative measurement. In some embodiments, an operating point is 30% SOC, 20% DOD and 1C.

At least for a part of the load cycles, one or several further operating points can be used that are different from the operating point already mentioned. This renders the measurement more informative with regard to different operating situations occurring during real operation of the battery cell.

In some embodiments, a load cycle comprises a first discharging, in which a first charge quantity from a first state of charge to a second state of charge is measured, a subsequent first charging, in which a second charge quantity from the second state of charge to a third state of charge is measured, and a second discharging, in which a third charge quantity from the third state of charge to a fourth state of charge is measured, wherein the charging and discharging of the load cycle takes place between a lower voltage and an upper voltage of the battery storage system.

In some embodiments, a first charge displacement can be determined by means of a difference between the fourth state of charge and the second state of charge, and a second charge displacement by means of a difference between the third state of charge and the first state of charge. Furthermore, a capacity loss can be determined from the difference between the first charge displacement and the second charge displacement, and a mean capacity loss can be calculated on the basis of at least two capacity losses of different load cycles.

The capacity loss thus determined can be used as an abort criterion. In particular, the relative change in capacity loss in two or more consecutive load cycles can be considered here. If this is sufficiently small, the battery cell can be considered to have already reached a steady state and the measurement can be aborted.

The capacity loss thus determined can also be used as an aging criterion of the battery cell. In addition to the aging criteria already mentioned, therefore, a further such criterion is available that renders the measurement more informative.

It is possible to select the abort criterion as a function of the classification resulting from the measurement result provided. For example, a measurement can be aborted if it becomes apparent for a battery cell that it must be considered as scrap or that it is sorted into a poor category.

The abort criteria used can be combined with one another. The measurement can thus be aborted for example if a minimum number of the previously measured load cycles is exceeded and the deviation of the capacity losses falls below a threshold value.

In some embodiments, a computer program product can be provided that can be loaded directly into a memory of a programmable computing unit. It comprises program code means to carry out the method according to the invention when the computer program product is executed in the computing unit. The computer program can be integrated into a higher-level process control and quality assurance of the battery cell production facility.

In some embodiments, the apparatus can also be integrated into existing production facilities without additional hardware if the power electronics used for formation (formation circuits) are also made available for HPC measurement or can be extended accordingly. In some embodiments, the apparatus can comprise a completely new station in the production process, which replaces or supplements an existing measurement station, for example for a self-discharge test.

FIG. 1 shows an apparatus 1 for classifying a battery cell 2 incorporating teachings of the present disclosure. The apparatus 1 comprises a high-precision coulometry apparatus 4 and a tempering chamber 3. A battery cell 2 to be classified is introduced into the tempering chamber 3 and connected by means of a power cable 11 to the high-precision coulometry apparatus 4.

The high-precision coulometry apparatus 4 is in turn connected to a computing unit 10 via a data cable 12. The high-precision coulometry apparatus 4 records a charge-time diagram of the battery cell 2 with very high precision. Here, the battery cell 2 is operated with a periodic load cycle 100.

The computing unit 10 comprises a computer program 13, which carries out the processing of the data transmitted by the high-precision coulometry apparatus 4. The computer program stores the values at least temporarily.

Figure 2:
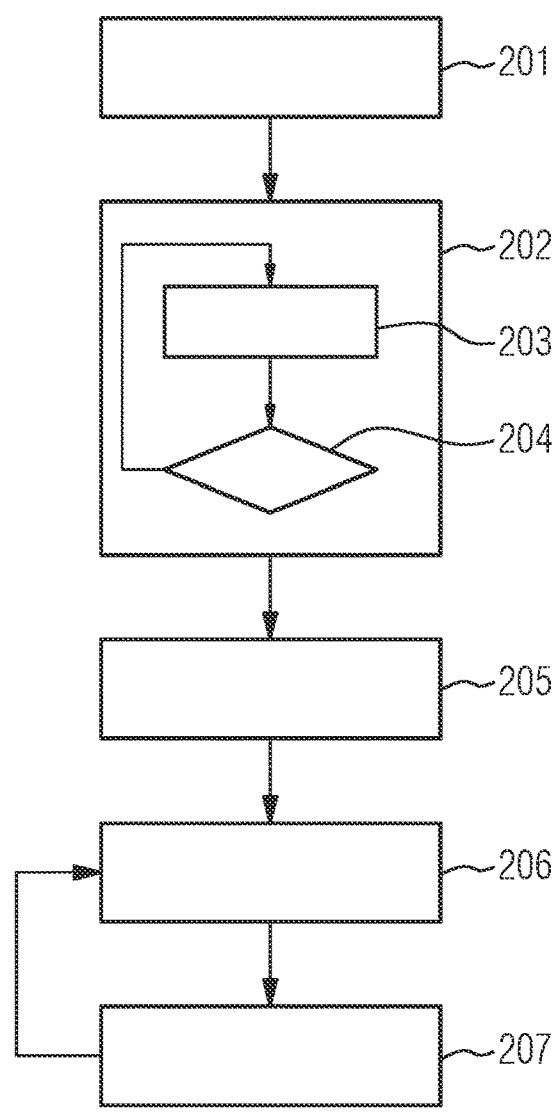
FIG. 2 a method flowchart for the classification of the battery cell by means of the apparatus incorporating teachings of the present disclosure.

FIG. 2 shows a flowchart for a method for classifying the battery cell 2 incorporating teachings of the present disclosure, which is carried out with the apparatus 1 shown in FIG. 1. Here, the calculation steps of the method are carried out by the computer program 13 on the computing unit 10.

In a first step 201, a battery cell 2, after formation, is introduced into the tempering chamber 3 and tempered. In this way, a constant temperature is reached during the subsequently measured load cycles 100. In some embodiments, the first step 201 can be omitted, depending on the manner in which the battery cell 2 is introduced into the tempering chamber 3, and in other embodiments this step 201 can take several hours.

The first step 201 is followed by a second step 202, in which a measurement of the battery cell 2 is carried out by means of the high-precision coulometry apparatus 4. Here, the load cycles 100 already mentioned are run through and at least current measurements carried out, which enable the charge quantities to be determined.

The second step 202 also comprises a third step 203, in which a current calibration is carried out with the data determined. Furthermore, the second step 202 also comprises a fourth step 204, in which a decision is made as to whether an abort criterion is present. If this is not the case, the measurement of the battery cell 2 is continued with a further load cycle 100.

Here, the third and fourth step 203, 204 can be carried out after each load cycle or always after a definable number of further measured load cycles. Here, the third and fourth step 203, 204 are in principle independent of one another, although they can also be carried out simultaneously. In the present example, the third and fourth step 203, 204 are carried out after 10 load cycles 100 in each case.

In this exemplary embodiment, a combination of different factors is used as the abort criterion. A first factor is a minimum number of load cycles 100, in this case 100. Experience has shown that the behavior of a battery cell does not reach a steady state before this number of load cycles 100. A deviation of the capacity loss between consecutive load cycles 100 is used as a further factor. This will be described below. If this deviation falls below 5%, it can be assumed that the battery cell 2 has reached a steady state. Furthermore, the abort criteria include which classification would result for the battery cell 2 if the data so far after the minimum number of load cycles 100 is considered. If this classification is such that the battery cell would be deemed scrap or would be sorted into a lower aging class, the further measurement is aborted. If on the other hand the battery cell 2 has a high expected quality with regard to aging, the measurement is continued.

If the abort criterion is fulfilled, the measurement of the battery cell 2 is terminated. Then, in a fifth step 205, a determination of final aging criteria takes place. In this example, in the fifth step 205 a coulombic efficiency and a mean capacity loss is determined and stored. The values determined are stored in a database together with an identification code, for example a serial number for the battery cell 2.

Based on the data determined, in a sixth step 206 a final classification of the battery cell 2 takes place. Here, the classification takes place into predetermined classes that are subsequently used as a quality criterion so as to use battery cells 2 of the same quality together wherever possible. This prevents the properties of a battery storage system from being determined disproportionately by individual "poor" battery cells 2. The classification therefore groups the battery cells 2 into classes with a similar expected aging.

Because the aging criteria determined in the fifth step 205 are stored together with the identification code, in a seventh step 207 the predictive values thus determined can be compared with actual aging data for the battery cells 2. To this end, such actual aging data on the battery cells 2 during the course of their deployment in an environment such as an electric car, a locomotive or a building battery is recorded and compared with the aging criteria. If during this process systematic deviations are identified in the expected aging, in other words ultimately in the classification, which correlate to one or several of the aging criteria, then the classification is corrected, for example the weighting of one of the aging criteria is changed. This changed weighting results in an improved classification of new battery cells 2.

Figure 3:
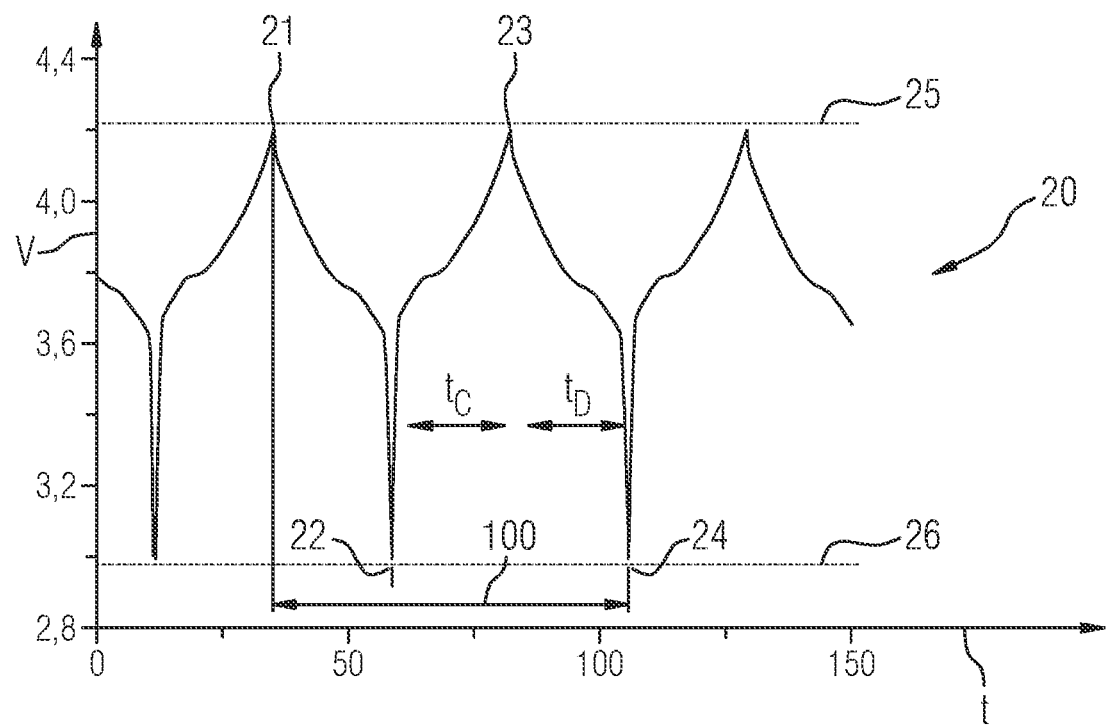
FIG. 3 a voltage-time diagram of a load cycle incorporating teachings of the present disclosure.

The actual measurement of the battery cells 2 takes place by means of the high-precision coulometry apparatus 4. FIG. 3 shows a voltage-time diagram that the high-precision coulometry apparatus 4 has recorded during a periodic load cycle 100 of the battery cell 2. A load cycle 100 comprises a discharging from a first state of charge 21 to a second state of charge 22, wherein the first state of charge 21 lies at an upper voltage 25 and the second state of charge 22 lies at a lower voltage 26. Then, in the load cycle 100, the battery storage system 2 is charged from the second state of charge 22 to a third state of charge 23. In the next step, in the load cycle 100, the third state of charge 23 is discharged to a fourth state of charge 24. In each individual charging/discharging step, an upper voltage 25 and a lower voltage 26 are observed as voltage limits. The charging takes place over the charging time $t_C$. The discharging takes place over the discharging time $t_D$.

Figure 4:
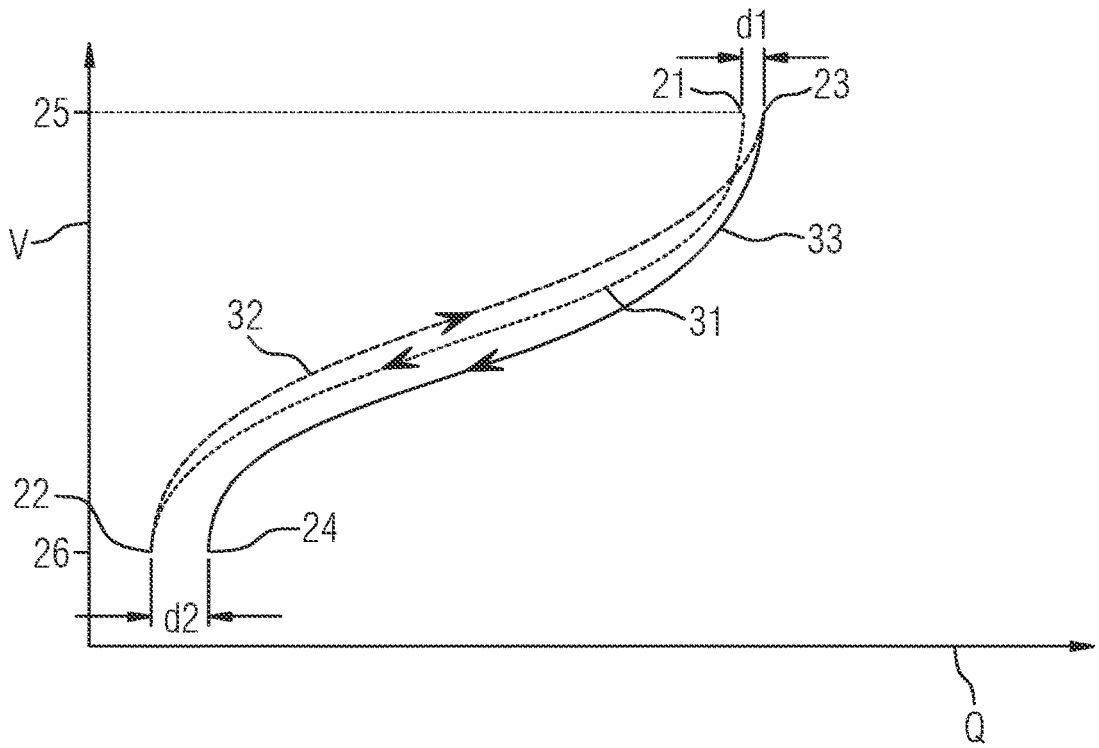
FIG. 4 a voltage-charge diagram of a load cycle incorporating teachings of the present disclosure.

Based on the measurement shown in FIG. 3, it is now possible to determine, as shown in FIG. 4, what cumulative charge quantity has flowed in the individual charging and discharging steps. FIG. 4 shows a diagram in which the voltage of the battery storage system is plotted over the cumulative charge quantity Q. The load cycle 100 once again begins at the first state of charge 21. The battery storage system 2 is discharged to the second state of charge 22 during the first discharging 31. Here, a first charge quantity Q1 is drawn from the battery storage system 2. The first charge quantity Q1 can be calculated using equation 1, wherein I designates the current flow and $t_D$ the discharge time:

$$Q1 = \int^{t_D} I(t)dt \qquad \text{Equation 1}$$

Within the load cycle 100, the battery storage system 2 is then charged from the second state of charge 22 to the third state of charge 23 by means of a first charging 32. A second charge quantity Q2 flows into the battery storage system 2. Q2 can be calculated by means of equation 2:

$$Q2 = \int^{t_C} I(t)dt \qquad \text{Equation 2}$$

Within the load cycle 100, the battery storage system 2 is then discharged from the third state of charge 23 to the fourth state of charge 24 by means of a second discharging 33. The charge quantity Q3 drawn can once again be calculated from the associated current flow from the discharge time in an analogous manner to equation 1.

It is now possible to determine a first charge displacement d1 between the first state of charge 21 and the third state of charge 23. Furthermore, a second charge displacement d2 can be determined between the second state of charge 22 and the fourth state of charge 24. It is now possible to determine a capacity loss dCap from the difference between the first charge displacement d1 and the second charge displacement d2 for the load cycle 100 by means of equation 3.

$$dCap = d2 - d1 \qquad \text{Equation 3}$$

Figure 5:
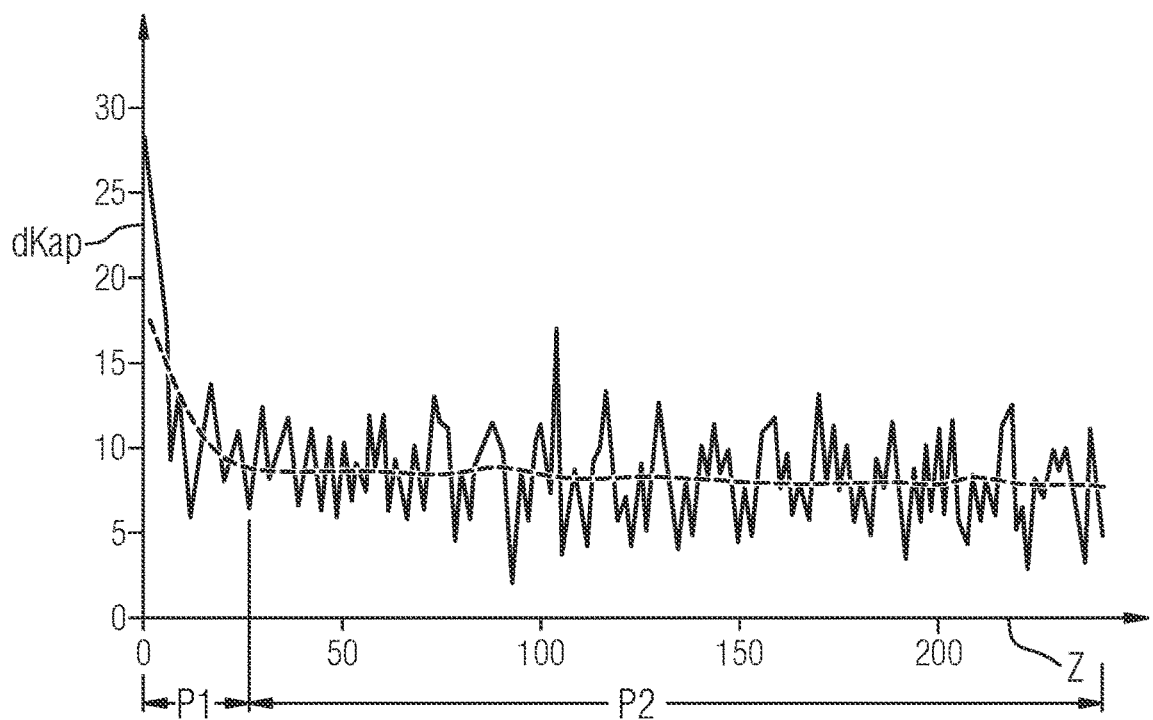
FIG. 5 a diagram of the capacity loss in the course of the load cycles incorporating teachings of the present disclosure.

FIG. 5 now shows the capacity loss per load cycle for 250 load cycles. Here, the x-axis shows the load cycle number Z, in other words the continuous number of the respective load cycle 100, while the y-axis shows the capacity loss dCap per load cycle 100. FIG. 5 illustrates that a transient phase P1 initially occurs during the consecutive load cycles 100. The length of the transient phase P1 is dependent on the operating point and the prior history of the battery cell 2.

The determination of the mean capacity loss $dCap_{mean}$ as the measured value of the method takes place via a sliding linear fit over the values of the capacity loss dCap and the determination of the smallest ascending gradients in the linear equations thus generated. Starting from a fit over all values of the capacity loss dCap, in other words value 1 to value 250, the dataset is continuously shortened and a new straight line generated (fitted) (2 to 250, 3 to 250, etc.).

The fit is carried out up to a certain minimum residual length of the dataset, e.g. 10% of the total length. The linear equations are then sorted in particular according to the values of their ascending gradients in ascending order of size. The measurement can be considered valid if at least two of the ascending gradients have a value amounting to less than 10% of the mean value of the last 10% of the capacity losses dCap. If for example the mean value of the last twenty capacity losses, in particular where at least 200 capacity losses are measured, amounts to 5 mAh/load cycle, then the ascending gradient of the two best adjusted tangents ("fits") should have less than 0.5 mAh/load cycle.

Otherwise the measurement must be repeated, in particular where there is a larger number of support points, because no sufficiently steady state of the system has been reached. From the sorting, a certain number, for example a rounded 3% of the total length of the dataset, or a minimum number of two measured values, is selected and the corresponding start indices of the fitted straight lines are determined. For each of the sections thus determined, an averaged capacity loss is specified as an arithmetic mean value over the included capacity losses dCap. The value of the mean capacity loss $dCap_{mean}$ is then determined as a mean value over the averaged individual capacity losses.

If no sufficiently steady, in other words substantially constant, capacity loss has yet been reached, the measurement of the load cycle is repeated. From the sorting, a certain number, for example a rounded 3% of the total length of the dataset, or a minimum number of two, is then once again selected and the corresponding start indices of the fitted straight lines are determined. For each of the sections thus determined, the mean capacity loss $dCap_{mean}$ is specified as the arithmetic mean value over the included capacity losses. The value of the mean capacity loss $dCap_{mean}$ can however also be determined as a mean value over the arithmetically averaged capacity losses.

FIG. 5 also illustrates that the transient phase P1 is followed by a determination phase P2. These phases can be displaced during the evaluation of the capacity losses dCap. In addition to the capacity loss, the coulombic efficiency is also used as an aging criterion. This is calculated as $$CE = Q3/Q2 \qquad \text{Equation 4}$$

For the current calibration carried out in the third step, use can be made of the fact that a discharge capacity Q0, which can be assigned to a discharged state, in other words for example to the second state of charge, can be calculated in two different ways, wherein the current calibration of the high-precision coulometry apparatus 4 is input differently into both calculations. Thus, according to a first rule, Q0 is $$Q_0 = \frac{d2}{1 - CE} \qquad \text{Equation 5}$$

Furthermore, Q0 can also be calculated from an initial discharge capacity Q0A, which is associated with a prior load cycle 100, and the capacity losses between the prior load cycle 100 and the current load cycle:

$$Q_{0m} = Q_{0A} + \Sigma dCap \qquad \text{Equation 7}$$

In the case of an ideal, in other words error-free current measurement, the two values are equal, i.e.

$$Q_0 = Q_{0m} \quad \text{Equation 8}$$

In reality, however, the two values diverge on account of the current calibration present in the current measurement, which is not completely exact. The greater the difference between the values, the more inaccurate the current calibration.

Equation 8 is used in the form $f = Q_0 - Q_{0m}$ as the basis for an optimization in which the function value f is to be minimized. The variables to be varied for the optimization form the current calibration. The current calibration is a mapping of a measured current value to a corrected measured value. If a substantial match between the values is achieved as a result of the optimization, then the corrected measured values correspond very precisely to the real current flow. The optimization is performed in the computing unit 10 of the computer program 13.

LIST OF REFERENCE CHARACTERS

1 Apparatus
2 Battery cell
3 Tempering chamber
4 High-precision coulometry apparatus
10 Computing unit
11 Power cable
12 Data cable
13 Computer program product
21 First state of charge
22 Second state of charge
23 Third state of charge
24 Fourth state of charge
25 Upper voltage
26 Lower voltage
100 Load cycle
$t_C$ Charging time
$t_D$ Discharging time
201 . . . 207 First step . . . seventh step

The invention claimed is:

1. A method for classifying a battery cell, the method comprising:
   measuring a plurality of load cycles of the battery cell using a high-precision coulometry apparatus to obtain a plurality of current values;
   repeating the measurement until an abort criterion is met;
   based on the result of the measurement, determining a first value and a second value for a discharge capacity of the battery cell using a first and a second calculation rule;
   wherein a calibration of the current measurement is input differently into the first calculation rule and the second calculation rule;
   carrying out an optimization method to determine a calibration of the current measurement, by achieving the greatest match between the first discharge capacity and the second discharge capacity;
   determining an aging criterion for the battery cell based on the result of the measurement; and
   sorting the battery cell into one of several classification ranges based on the aging criterion.

2. The method as claimed in claim 1, wherein the aging criterion includes a coulombic efficiency of the battery cell.

3. The method as claimed in claim 1, wherein the aging criterion includes an energy efficiency and/or an effective cell internal resistance and/or a capacity loss per cycle of the battery cell.

4. The method as claimed in claim 1, further comprising storing the aging criteria with an identification code for the battery cell in a database.

5. The method as claimed in claim 4, further comprising:
   receiving real aging data of battery cells in use in a battery storage system; and
   adjusting the classification ranges on the basis of the real aging data and the stored aging criteria.

6. The method as claimed in claim 1, wherein the load cycles comprise a discharge of less than 40%.

7. The method as claimed in claim 1, wherein the load cycles can work with a C coefficient of between 0.5 and 1.5.

8. The method as claimed in claim 1, wherein several operating points are used for at least a part of the load cycles.

9. The method as claimed in claim 1, wherein a load cycle comprises:
   a first discharging, wherein a first charge quantity from a first state of charge to a second state of charge is measured;
   a subsequent first charging, in which a second charge quantity from the second state of charge to a third state of charge is measured; and
   a second discharging, in which a third charge quantity from the third state of charge to a fourth state of charge is measured;
   wherein the charging and discharging of the load cycle takes place between a lower voltage and an upper voltage of the battery cell.

10. The method as claimed in claim 9, further comprising:
    determining a first charge displacement using a difference between the fourth state of charge and the second state of charge;
    determining a second charge displacement using a difference between the third state of charge and the first state of charge;
    determining a capacity loss from the difference between the first charge displacement and the second charge displacement; and
    determining a mean capacity loss on the basis of at least two capacity losses of different load cycles.

11. The method as claimed in claim 10, wherein the abort criterion includes the relative change in capacity loss in two or more consecutive load cycles.

12. The method as claimed in claim 1, further comprising selecting the abort criterion as a function of the classification resulting from the measurement result.

13. An apparatus comprising:
    a high-precision coulometry apparatus;
    a computing unit with a memory for receiving results of a measurement series on the battery cell, wherein the computing unit is programmed to:
    measure a plurality of load cycles of the battery cell using the high-precision coulometry apparatus to obtain a plurality of current values;
    repeat the measurement until an abort criterion is met;
    based on the result of the measurement, determine a first value and a second value for a discharge capacity of the battery cell using a first and a second calculation rule;
    wherein a calibration of the current measurement is input differently into the first calculation rule and the second calculation rule; and
    carry out an optimization method to determine a calibration of the current measurement, by achieving the greatest match between the first discharge capacity and the second discharge capacity;
    determine an aging criterion for the battery cell based on the result of the measurement; and sort the battery cell into one of several classification ranges based on the aging criterion.

14. A non-transitory computer memory storing a set of instructions directly loadable into a memory of a programmable computing unit, the set of instructions when executed by a processor causing the processor to:
- measure a plurality of load cycles of the battery cell using a high-precision coulometry apparatus to obtain a plurality of current values;
- repeat the measurement until an abort criterion is met;
- based on the result of the measurement, determine a first value and a second value for a discharge capacity of the battery cell using a first and a second calculation rule;
- wherein a calibration of the current measurement is input differently into the first calculation rule and the second calculation rule; and
- carry out an optimization method to determine a calibration of the current measurement, by achieving the greatest match between the first discharge capacity and the second discharge capacity;
- determine an aging criterion for the battery cell based on the result of the measurement; and
- sort the battery cell into one of several classification ranges based on the aging criterion.

\* \* \* \* \*